United States Patent [19]

Chang et al.

[11] Patent Number: 5,006,480
[45] Date of Patent: Apr. 9, 1991

[54] METAL GATE CAPACITOR FABRICATED WITH A SILICON GATE MOS PROCESS

[75] Inventors: C. P. Chang, Newport Beach; Joseph Farb, Riverside, both of Calif.

[73] Assignee: Hughes Aircraft Company, Los Angeles, Calif.

[21] Appl. No.: 479,557

[22] Filed: Feb. 13, 1990

Related U.S. Application Data

[60] Continuation-in-part of Ser. No. 229,540, Aug. 8, 1988, abandoned, which is a division of Ser. No. 918,185, Oct. 14, 1986, abandoned.

[51] Int. Cl.$^5$ .............................. H01L 21/70
[52] U.S. Cl. ......................... 437/47; 437/52; 437/60; 437/228; 437/235; 437/919; 357/23.6; 357/51
[58] Field of Search ............... 437/47, 51, 52, 60, 437/69, 228, 233, 235, 919, 982; 357/23.6, 51

[56] References Cited

U.S. PATENT DOCUMENTS

| | | | |
|---|---|---|---|
| 3,693,428 | 9/1982 | Ferrel ............................... | 437/919 |
| 4,001,049 | 4/1977 | Baglin et al. ...................... | 437/174 |
| 4,214,252 | 7/1980 | Goerth ............................. | 357/23.6 |
| 4,224,089 | 9/1980 | Nishimoto et al. ................ | 437/982 |
| 4,293,588 | 10/1981 | Neukomm ........................ | 437/69 |
| 4,413,401 | 11/1983 | Klein et al. ....................... | 437/919 |
| 4,432,133 | 2/1984 | Furuyama ........................ | 437/69 |
| 4,466,177 | 8/1984 | Chao ................................. | 437/60 |
| 4,518,630 | 5/1985 | Grasser ............................. | 437/238 |
| 4,535,528 | 8/1985 | Chen et al. ....................... | 437/982 |
| 4,571,607 | 2/1986 | Togei ................................ | 357/23.4 |
| 4,603,059 | 7/1986 | Kiyosumi et al. ................ | 437/919 |
| 4,638,400 | 1/1987 | Brown et al. .................... | 437/919 |
| 4,700,457 | 10/1987 | Matsakawa ....................... | 437/60 |
| 4,746,377 | 5/1988 | Kobayashi ........................ | 437/40 |

FOREIGN PATENT DOCUMENTS

| | | | |
|---|---|---|---|
| 0112750 | 9/1981 | Japan ................................. | 357/23.6 |
| 0053213 | 6/1982 | Japan ................................. | 357/23.6 |
| 1992498 | 12/1982 | Japan ................................ | 357/23.6 |
| 0017619 | 2/1983 | Japan ................................. | 437/919 |
| 00166756 | 10/1983 | Japan ............................... | 437/47 |
| 0047755 | 3/1984 | Japan ................................. | 357/23.6 |

OTHER PUBLICATIONS

Ghandhi, "VLSI Fabrication Principles" John Wiley and Sons, N.Y. 1983, pp. 300–301, 353–354, 631–633, 378–385.

*Primary Examiner*—Brian E. Hearn
*Assistant Examiner*—Tom Thomas
*Attorney, Agent, or Firm*—Terje Gudmestad; W. K. Denson-Low

[57] ABSTRACT

A method for making metal gate MOS capacitors with standard silicon gates processes, including the steps of providing a semiconductor substrate and defining active areas and capacitor areas therein, forming field oxide regions that generally surround the active areas and the capacitor areas, forming a gate oxide layer over the active areas and the capacitor areas, and forming polysilicon gates over the active areas. Highly doped source and drain regions in the active areas and highly doped bottom capacitor plate regions in the capacitor areas are then formed, and blanket oxide layer is deposited over the semiconductor structure. The capacitor areas are opened to expose the highly doped bottom capacitor plate regions, and the semiconductor structure is heated to reflow the deposited oxide layer and to grow a capacitor oxide layer over the exposed capacitor areas.

1 Claim, 4 Drawing Sheets

METAL GATE CAPACITOR FABRICATED WITH A SILICON GATE MOS PROCESS

This is a continuation-in-part of U.S. Ser. No. 07/229,540, filed Aug. 8, 1988, now abandoned, which was a division of U.S. Ser. No. 06/918,185, filed Oct. 14, 1986, abandoned.

BACKGROUND OF THE INVENTION

The disclosed invention generally relates to metal gate metal-oxide-silicon (MOS) capacitors, and is particularly directed to a process for making metal gate MOS capacitors with standard silicon gate processes. The metal gate capacitors made in accordance with the invention have capacitance values which are reliably controlled in manufacture and which have reduced variation with voltage.

In integrated circuits made with known silicon gate MOS processes, capacitors are formed during the process of forming other elements, such as transistors, by application of selected ones of the process steps to the areas that are to include capacitors. Particularly, with known silicon gate processes, a capacitor may be implemented as a "polysilicon gate capacitor" or as a "polysilicon to polysilicon gate capacitor."

An important consideration with a polysilicon gate capacitor is the need for an extra highly doped N+ or P+ region, which also requires additional process steps. Also, the capacitance value of a polysilicon gate capacitor is that its capacitance value is limited by the particular process utilized to provide the gate oxide that forms the dielectric of the capacitor, unless additional processing steps are utilized. Furthermore, the capacitance of a polysilicon gate capacitor varies considerably with the voltage applied across its terminals.

An important consideration with a polysilicon to polysilicon gate capacitor is the need for an extra layer of polysilicon. Further, the capacitance value of a polysilicon to polysilicon gate capacitor is difficult to control due to variation of polysilicon oxide thickness. Also, a polysilicon to polysilicon gate capacitor has the poor oxide dielectric strength due to polysilicon asperities.

In integrated circuits made with known metal gate processes, capacitors are also formed during the process of forming other elements by application of selected ones of the process steps to the areas that are to include capacitors. However, with metal gate processes the source and drain regions are typically implanted prior to metallization of the gates which presents alignment problems.

SUMMARY OF THE INVENTION

It would therefore be an advantage would be to provide a process for making a metal gate MOS capacitor which utilizes silicon gate MOS processes.

The foregoing and other advantages are provided in a method that includes the steps of providing a semiconductor substrate and defining active areas and capacitor areas therein, forming field oxide regions that generally surround the active areas and the capacitor areas, forming a gate oxide layer over the active areas and the capacitor areas, and forming polysilicon gates over the active areas. Highly doped source and drain regions in the active areas and highly doped bottom capacitor plate regions in the capacitor areas are then formed, for example by ion implantation, and a blanket oxide layer is deposited over the semiconductor structure. The capacitor areas are opened to expose the highly doped bottom capacitor plate regions, and the semiconductor structure is heated to reflow the deposited oxide layer and to grow a capacitor oxide layer over the exposed capacitor areas.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
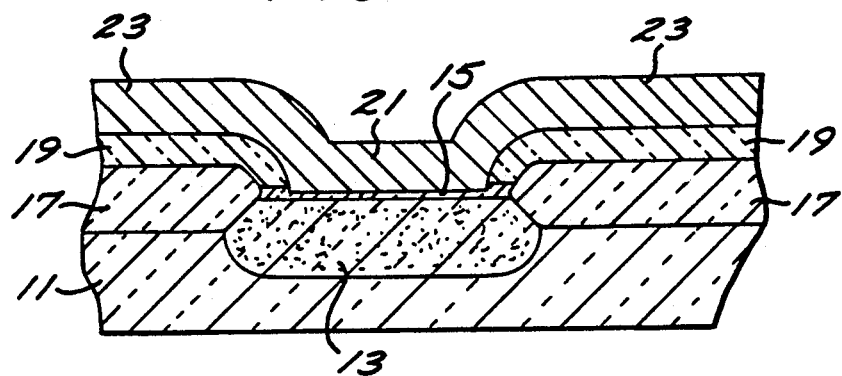
FIG. 1 is a cross-sectional view of an MOS capacitor structure in accordance with the invention.

In the following detailed description and in the several figures of the drawing, like elements are identified with like reference numerals.

Figure 2:
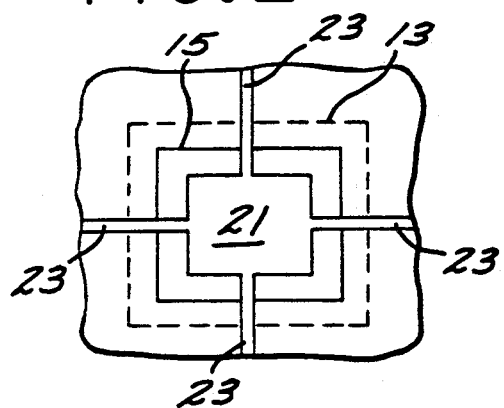
FIG. 2 is a top plan view of the MOS capacitor structure of FIG. 1.

Referring now to FIGS. 1 and 2, shown therein is an MOS capacitor structure 10 in accordance with the invention and which includes an N− silicon substrate 11. A highly doped P+ region 13 is formed in the silicon substrate 11 and extends downwardly from the top surface of the portion of the substrate 11 where the highly doped P+ region 13 is formed. As discussed more fully herein, the highly doped P+ region 13 may be formed by ion implantation.

As shown, the highly doped P+ region 13 extends slightly upwardly above the adjacent top surface of the silicon substrate 11. A gate oxide layer 15 is disposed on the top surface of the highly doped P+ region 13. A field oxide region 17 surrounds the highly doped P+ region 13 and is on the top surface of the substrate 11 that is adjacent the highly doped P+ region 13. The field oxide 17 has a continually reduced thickness as it merges toward the gate oxide layer 15.

A deposited oxide layer 19 is disposed on top of the field oxide 17 and extends downwardly toward the outer portion of the gate oxide layer 15. A metal gate 21 is formed on the central portion of the gate oxide layer 17 and is separated from the deposited oxide layer 19. As illustrated in FIG. 2, the metal gate 21 is rectangular in top plan view, and four metallic contact leads 23 are generally distributed about and extend outwardly from the metal gate 21. Specifically, the contact leads 23 extend outwardly from the respective sides of the metal gate 21.

The highly doped P+ region 13 forms the bottom capacitor plate of the capacitor structure 10, while the metal gate 21 forms the top capacitor plate. The gate oxide layer 15 is the dielectric between such capacitor plates.

By way of example, the field oxide region 17 may have a thickness of about 5,000 to 12,000 Angstroms (Å), while the deposited oxide layer 19 may have a thickness of about 4,000 to 8,000 Å. The thickness of the gate oxide 15 affects the capacitance value and may have a thickness of about 200 to 900 Å beneath the metal gate 21. The metal gate 21 may have a thickness of about 6,000 to 15,000 Å.

The distributed four contact leads 23 are provided so that the variation in stray capacitance due to the lead structure connected to the metal gate 21 is reduced. While a single contact lead may provide for less stray capacitance, such single lead generally would have greater stray capacitance variation than the four lead structure with processing variations including the following.

Oxide thickness variation would be distributed among the four contact leads 23 and therefore would have a smaller effect on the stray capacitance resulting from the four contact leads 23. To the extent that oxide thickness variation may be limited to one or two of the contact leads 23, the resulting stray capacitance variation would still be small relative to the total stray capacitance due to the four contact leads 23. With a single contact lead, oxide thickness variation would be concentrated on that one lead, which generally would result in greater stray capacitance variation since there are no other leads that might provide offsetting variations.

Further, since the four contact leads 23 are distributed about the metal gate 21, variation in the location of the metal gate 21 would have a smaller effect on the stray capacitance of four leads than on the stray capacitance of a single contact lead. This is more readily understood by considering, for example, displacement of the location of the metal gate 21 to the left (FIG. 2). While the left lead 23 will be shorter and will contribute less to the stray capacitance, the right lead 23 will be longer and will contribute more to the stray capacitance. Thus, the capacitance variations due to the individual left and right leads 23 tend to offset each other. Consider now a single lead and, for example, displacement of the metal gate 21 which results in a greater portion of the single lead being over the highly doped P+ region 13. The stray capacitance due to such single lead would be increased, with no offsetting reduction.

Also, variations in the dimensions of the four contact leads 23 would tend to have a smaller effect on the stray capacitance since such dimensional variations are distributed among the four leads. To the extent that any dimensional variation may be limited to one or two of the leads, the resulting stray capacitance variation would still be small relative to the total stray capacitance due to the four contact leads 23. The variation in the dimensions of a single contact lead would have a greater effect on the stray capacitance due to such single lead since there are no other leads that might provide offsetting variations.

Since the stray capacitance due to the four contact leads 23 varies less with processing variations than the stray capacitance for a single contact lead, the stray capacitance due to the four contact leads 23 is more predictable than the stray capacitance for one lead. Thus, the total capacitance provided by the capacitor structure 10, which includes the lead structure stray capacitance and the metal gate capacitance, is more readily controlled.

It should be noted that the distribution of the four contact leads 23 does not necessarily have to be precisely uniform. In other words, each of the four contact leads 23 does not have to be centered on its respective side of the metal gate 21. The important consideration is that the contact lead structure be distributed about the metal gate instead of being concentrated at one location.

While four leads 23 are shown in FIG. 2, it should be readily appreciated that other distributed lead structures may be utilized, such as three leads that are distributed about the metal gate 21. Also, two generally opposing leads may be utilized.

The foregoing capacitor structure is readily made with a one metal layer process, wherein the metal gate 21 and the metallic leads 23 are formed in a single metallization and masking process.

Figure 4:
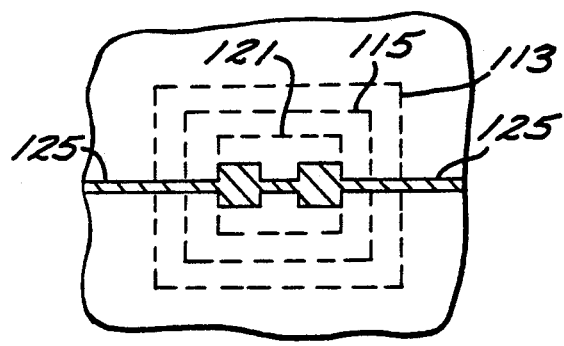
FIG. 4 is a top plan view of the MOS capacitor structure of FIG. 3.
Figure 3:
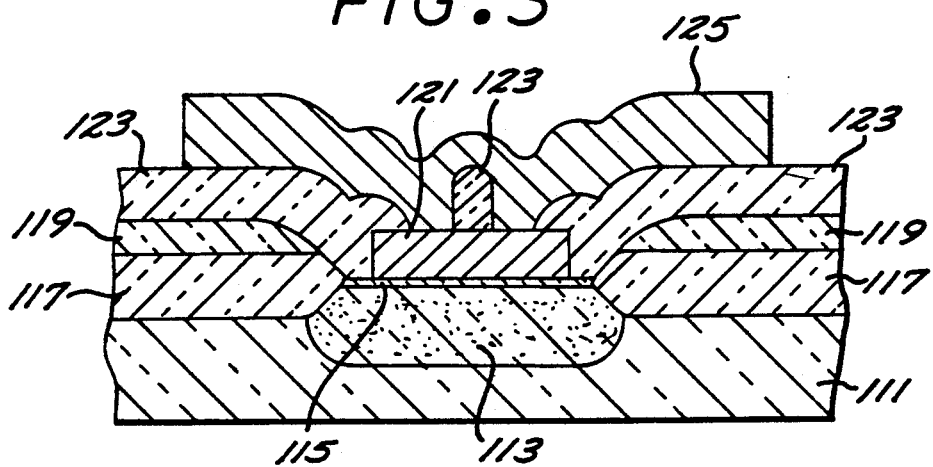
FIG. 3 is a cross-sectional view of a further MOS capacitor structure in accordance with the invention.

Referring now to FIGS. 3 and 4, shown therein is a further MOS capacitor structure 110 in accordance with the invention and which includes an N− silicon substrate 111. A highly doped P+ region 113 is formed in the silicon substrate 111 and extends downwardly from the top surface of the portion of the substrate 111 where the highly doped P+ region 113 is formed. As discussed more fully herein, the highly doped region 13 may be formed by ion implantation.

As shown, the highly doped P+ region 113 extends slightly upwardly above the adjacent top surface of the silicon substrate 111. A gate oxide layer 115 is disposed on the top surface of the highly doped P+ region 113. A field oxide region 117 surrounds the highly doped P+ region 113 and is on the top surface of the substrate 111 that is adjacent the highly doped P+ region 113. The field oxide region 117 has a continually reduced thickness as it merges toward the gate oxide layer 115.

A first deposited oxide layer 119 is disposed on top of the field oxide 117 and extends downwardly toward the outer portion of the gate oxide layer 115. A metal gate 121 is formed on the central portion of the gate oxide layer 117 and is separated from the deposited oxide layer 119. As illustrated, the metal gate 121 is rectangular in top plan view.

A second deposited oxide layer 123 is disposed on the metal gate 121, on the exposed portions of the gate oxide 115 and the field oxide 117, and on the first deposited oxide layer 119. Metallic contact leads 125 are disposed on the second deposited oxide layer 123 and extend downwardly through vias 127 into conductive contact with the metal gate 121. By way of example, as shown, two interconnected contact leads 125 and two vias 127 may be provided. Alternatively, one or two interconnected contact leads may be utilized with a single via.

By way of example, the field oxide region 117 may have a thickness of about 5,000 to 12,000 Å, and the deposited oxide layer 119 may have a thickness of about 4,000 to 8,000 Å. The thickness of the gate oxide 115 affects the capacitance value and may have a thickness of about 200 to 900 Å beneath the metal gate 121. The metal gate 121 may have a thickness of about 6,000 to 15,000 Å, while the second deposited oxide layer 123 may have a thickness of about 8,000 to 15,000 Å.

The capacitor structure 110 of FIGS. 3 and 4 is readily made with a two metal layer process. The metal gate 121 is formed during the first metallization and masking process, and the metal leads 125 are formed during the second metallization and masking process.

In the capacitor structure 110 of FIGS. 3 and 4, the metallic leads 125 are separated considerably from the highly doped region 113. As a result, the total capacitance of the capacitor structure 110 is more readily controlled. Such total capacitance includes the capacitance resulting from the metal gate 121 and the stray capacitance due to the leads 125.

More particularly, since the leads 125 are separated considerably from the highly doped P+ region 113, variation in location of the metal gate 121 would have a small effect on the stray capacitance due to the leads 125. Variations in the oxide thickness and the dimensions of the leads 125 would also have a small effect on the stray capacitance due to the leads 125.

The foregoing capacitor structures 10 and 110 may be formed in integrated circuits by use of known silicon gate MOS processes. Since the capacitor structures have different lead structures, the specific processes would differ as to whether one layer or two layer metallization and masking processing is utilized. The processes that are common to both capacitor structures 10 and 110 will be described with reference to FIGS. 5A through 5J.

An appropriate silicon substrate 211, which for example may be N−, is provided and oxidized to provide an oxide layer 213 on the substrate 211. A silicon nitride layer 215 is deposited to provide the structure shown in FIG. 5A. By way of example, the thickness of the oxide layer 213 may be about 900 Å, and that of the nitride layer 215 may be about 1200 Å.

Figure 5A:
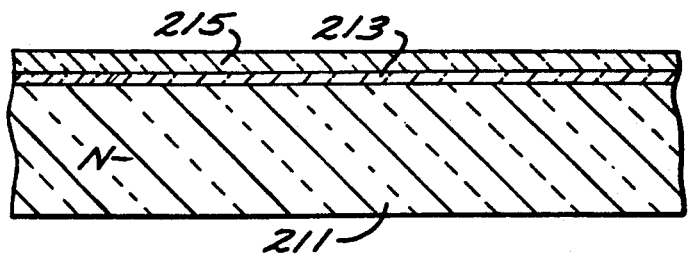
FIGS. 5A through 5I are cross-sectional views which are useful in understanding the process steps of the invention whereby metal gate capacitors are made with standard sukucib gate oricesses.
Figure 5B:
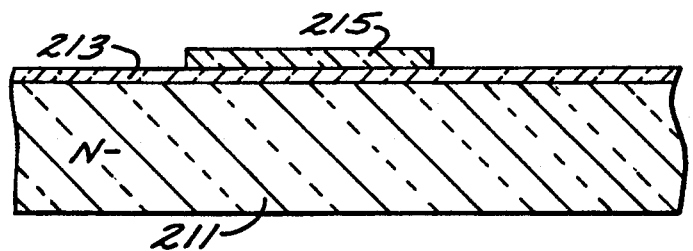

The areas for metal gate capacitors in accordance with the invention are defined in the same procedure utilized for defining the active areas, by appropriate masking and etching to maintain the nitride layer over the active areas and the capacitor areas, as shown in FIG. 5B with the nitride layer 215 above an illustrated capacitor area.

A P-well is then formed for the n-channel devices and, if appropriate, an N-well can be formed, all in accordance with standard silicon gate CMOS processes. It should be appreciated that the metal gate capacitors in accordance with the invention can be formed in wells. For ease of illustration, the wells are not shown in the figures.

Pursuant to standard silicon gate processing, field implants as appropriate would be made after the well formation procedures.

Figure 5C:
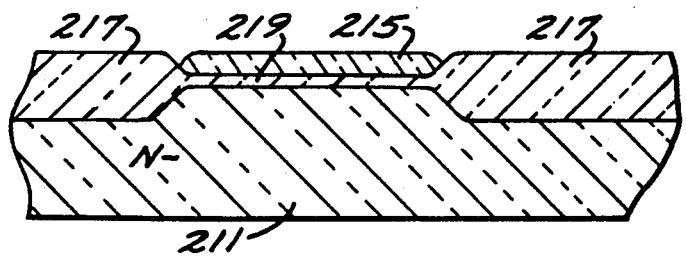

The wafer is then oxidized at an elevated temperature to grow field oxide around the active areas and the capacitor areas to result in the structure shown in FIG. 5C which includes field oxide 217 around the remaining nitride layer 215 that is above the illustrated capacitor area. The oxide layer beneath the nitride layer 215 forms a gate oxide layer 219.

After growth of the field oxide, the nitride layer 215 over the active areas and the capacitor areas is removed, for example by phosphoric acid. The oxide on the wafer is then removed to a sufficient degree to remove the gate oxide layer 219 over the active areas and the capacitor areas is removed.

Threshold voltage shift implants pursuant to standard processing techniques can then be made after the gate oxide is removed.

Figure 5D:
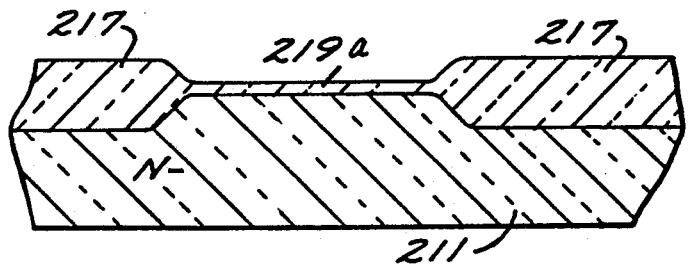

Next, a further gate oxide layer 219a is grown to providing the appropriate thickness for the active areas, the structure of FIG. 5D relative to the illustrated capacitor region. Depending on the particular process being utilized, threshold voltage shift implants can be made after the gate oxide layer 219a is grown instead of before it is grown.

After the gate oxide is regrown, and after any threshold voltage shift implants that may have occurred after regrowth of the gate oxide, a blanket polysilicon layer is deposited on the wafer. The deposited polysilicon layer is doped, masked, and etched to form gates, interconnect gates, and other elements as understood by persons skilled in the art. Pursuant to etching of the polysilicon, the polysilicon layer is retained over the active areas, but not over the areas for the metal gate capacitors in accordance with the invention.

Next, the source and drain regions of the active areas and the metal gate capacitor areas in accordance with the invention are implanted. As particularly shown in FIG. 5E, the metal gate capacitor areas will be implanted like the source and drain regions of the P-channel active areas. It should be appreciated that as to the active areas, the polysilicon gates protect the channel regions, and the source and drain regions are defined by the areas between the polysilicon gates and the field oxide regions. As to the capacitor areas, they are defined by the field oxide regions.

By way of illustrative example, an N+ photoresist mask is applied to protect the areas that are to be P+ from the N+ implant, and the wafer is subjected to a heavy N+ dose, for example by phosphorous ion implantation.

Figure 5E:
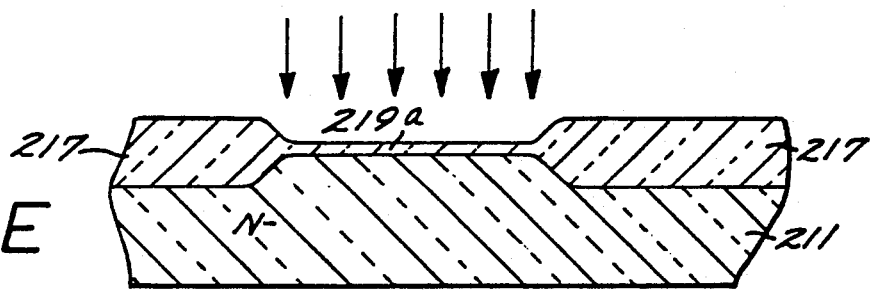
Figure 5F:
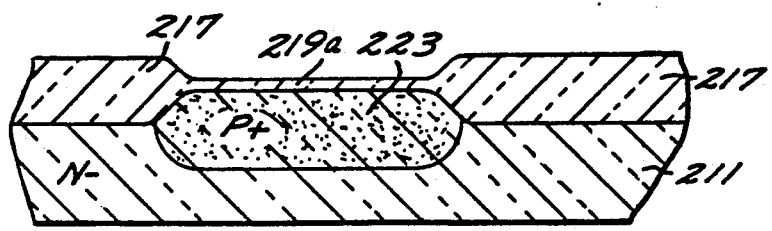

A P+ mask is applied to protect the N+ areas, and the wafer is subjected to a heavy P+ dose, for example by boron ion implantation, which would form the P+ source and drain regions of the P-channel devices and the P+ regions of the metal gate capacitors in accordance with the invention, as shown in FIG. 5E relative to the illustrated capacitor area.

Figure 5G:
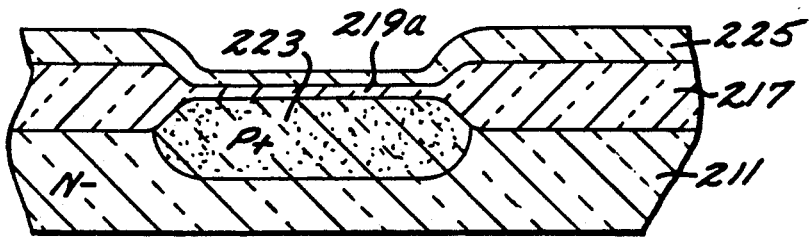
Figure 5H:
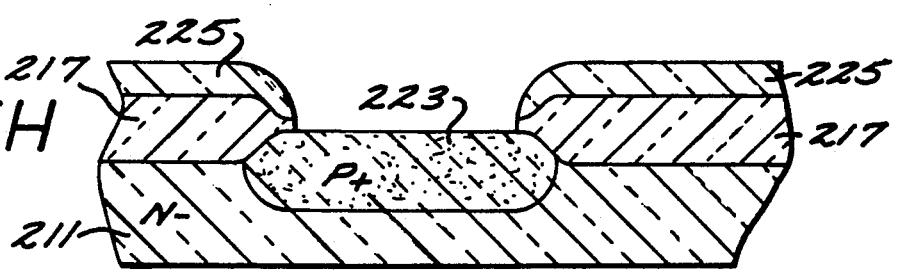

After the N+ and P+ junction implants, appropriate low pressure vapor deposition (e.g., with 7% phosphorous) provides a deposited oxide layer 225, as illustrated in FIG. 5G. The wafer is masked and etched to open up the capacitor areas, as shown in FIG. 5H as to the illustrated capacitor area.

The wafer is then oxidized at an elevated temperature to reflow (densify) the deposited oxide layer 225, and to grow a capacitor gate oxide layer 219b in the capacitor areas. Such oxidation is precisely controlled to precisely control the thickness of the capacitor oxide layer 219b to achieve the desired capacitance.

Figure 5I:
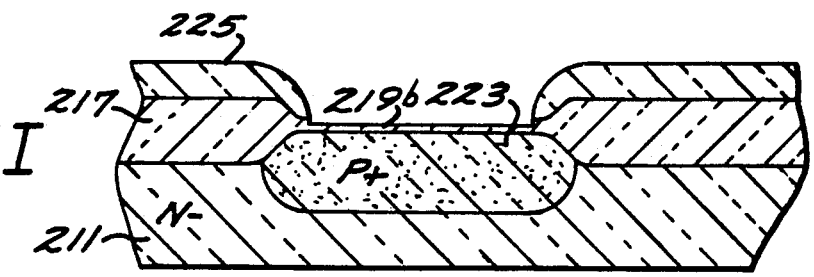

From the structure of FIG. 5I, the capacitor structure 10 of FIGS. 1 and 2 is formed by appropriate one layer metallization and masking processing. It should be noted that the substrate 211 of FIG. 5I corresponds to the substrate 11 of FIG. 1, the highly doped region 223 of FIG. 5I corresponds to the highly doped region 13 of FIG. 1, and the capacitor oxide layer 219b of FIG. 5I corresponds to the gate oxide layer 15 of FIG. 1. Further, the field oxide region 217 of FIG. 5I corresponds to the field oxide region 17 of FIG. 1, and the deposited oxide layer 225 of FIG. 5I corresponds to the deposited oxide layer 19 of FIG. 1.

The capacitor structure 110 of FIGS. 3 and 4 is formed by appropriate two layer metal processing of the structure of FIG. 5I. It should be noted that the substrate 211 of FIG. 5I corresponds to the substrate 111 of FIG. 2, the highly doped region 223 of FIG. 5I corresponds to the highly doped region 113 of FIG. 2, and the capacitor oxide layer 219b of FIG. 5I corresponds to the gate oxide layer 115 of FIG. 2. Further, the field oxide region 217 of FIG. 5I corresponds to the field oxide region 117 of FIG. 2, and the deposited oxide layer 225 of FIG. 5I corresponds to the deposited oxide layer 119 of FIG. 2.

From the foregoing, it should be readily appreciated that the process of the invention is readily implemented with a standard silicon gate CMOS process by adding a step of masking and etching to open the capacitor areas.

The capacitor areas are defined at the same times as the active areas are defined, and the capacitor oxide is grown during reflow of the deposited oxide layer. Stated another way, the metal gate capacitor areas in accordance with the invention are processed similarly to the active areas, except that they do not have polysilicon gates and they are subjected to growth of a different gate oxide. In this manner, very precise metal gate capacitors can be made using standard polysilicon gate processes, with the capacitor gate oxide thickness being controlled independently of the active device gate oxide thickness.

The standard process for making polysilicon gate capacitors requires masking and implantation of the capacitor areas after the field oxide is grown, and before deposition of the polysilicon layer, since the polysilicon gates formed over the capacitor areas prevent implantation of such areas during the N+ and P+ junction implants. Moreover, the gate oxide for polysilicon capacitors is the same as the gate oxide for the active devices, and thus might not be capable of being controlled to provide the desired capacitance due to the gate oxide requirements of the active devices.

While the foregoing capacitor structures and processes have been discussed in the context of an N− substrate and a highly doped P+ region, it should be readily appreciated that other conductivity types may be utilized.

For example, a P− substrate would be utilized with a highly doped N+ region, which may be achieved by ion implantation of phosphorous. Further, P and N wells may also be utilized with respective N+ and P+ highly doped regions.

Although the foregoing has been a description and illustration of specific embodiments of the invention, various modifications and changes thereto can be made by persons skilled in the art without departing from the scope and spirit of the invention as defined by the following claims. Such modifications may include capacitor shape, number and position of leads, or the manner in which doping is performed.

What is claimed is:

1. A process for making MOS metal gate capacitors with a silicon gate process, comprising the steps of:
   providing a semiconductor substrate and defining active areas and capacitor areas on the surface thereof;
   forming field oxide regions that generally surround the active areas and the capacitor areas;
   forming a gate oxide layer over the active areas and the capacitor areas;
   forming polysilicon polysilicon gates over the active areas;
   forming highly doped source and drain regions in the active areas and highly doped bottom capacitor plate regions in the capacitor areas;
   depositing an oxide layer over the semiconductor structure;
   opening the capacitor areas to expose the highly doped bottom capacitor plate regions; and
   heating the semiconductor structure to reflow the deposited oxide layer and to grow a capacitor oxide layer over the exposed capacitor areas.

* * * * *